US012805372B2

(12) United States Patent
Riou et al.

(10) Patent No.: US 12,805,372 B2
(45) Date of Patent: Nov. 17, 2026

(54) METHOD FOR MOUNTING AN ELECTRONIC COMPONENT ONTO A SUBSTRATE BY MEANS OF SINTERING

(71) Applicant: SAFRAN ELECTRONICS & DEFENSE, Paris (FR)

(72) Inventors: Jean-Christophe Riou, Moissy-Cramayel (FR); Corinne Pons, Moissy-Cramayel (FR); Alain Jaussent, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 534 days.

(21) Appl. No.: 18/283,972

(22) PCT Filed: Mar. 28, 2022

(86) PCT No.: PCT/FR2022/050572
§ 371 (c)(1),
(2) Date: Sep. 25, 2023

(87) PCT Pub. No.: WO2022/200749
PCT Pub. Date: Sep. 29, 2022

(65) Prior Publication Data
US 2024/0170450 A1 May 23, 2024

(30) Foreign Application Priority Data
Mar. 26, 2021 (FR) ...................................... 2103058

(51) Int. Cl.
*H10W 72/30* (2026.01)
*H10W 90/00* (2026.01)
*H10W 72/00* (2026.01)

(52) U.S. Cl.
CPC ........... *H10W 72/30* (2026.01); *H10W 90/00* (2026.01); *H10W 72/07141* (2026.01);
(Continued)

(58) Field of Classification Search
CPC ... H10W 70/60; H10W 70/611; H10W 72/00; H10W 72/01357; H10W 72/01365;
(Continued)

(56) References Cited

U.S. PATENT DOCUMENTS 5,893,511 A 4/1999 Schwarzbauer
2014/0061909 A1 3/2014 Speckels et al.
(Continued)

FOREIGN PATENT DOCUMENTS

DE 10 2012 200 034 A1 7/2013
DE 102012207652 A1 * 11/2013 ............ H10W 72/30
(Continued)

OTHER PUBLICATIONS

Can Yin et al., "Processing and electrical properties of sodium citrate capped silver nanoparticle based inks for flexible electronics", 18th International Conference on Electronic Packaging Technology, IEEE, Aug. 16, 2017, pp. 1572-1576.
(Continued)

*Primary Examiner* — Brook Kebede
(74) *Attorney, Agent, or Firm* — Sughrue Mion, PLLC

(57) ABSTRACT

The method comprises the following successive steps: — depositing sintering material (26) onto one of an electronic component (28) and a substrate (30); — heating the material (26) so as to bring a temperature of the material to a preliminary exothermic peak, which precedes an exothermic sintering peak, without the temperature of the material reaching a maximum of the preliminary exothermic peak; — fastening the other of the component (28) and the substrate (30) to the material (26) so that the material is interposed between the component and the substrate; and— pressing the material (26) while hot so as to cause it to creep.

20 Claims, 5 Drawing Sheets

(52) U.S. Cl.
CPC ................ *H10W 72/07163* (2026.01); *H10W 72/07183* (2026.01); *H10W 72/07331* (2026.01); *H10W 72/07332* (2026.01); *H10W 72/07341* (2026.01); *H10W 72/07354* (2026.01); *H10W 72/347* (2026.01); *H10W 72/352* (2026.01)

(58) Field of Classification Search
CPC ..... H10W 72/07141; H10W 72/07163; H10W 72/07183; H10W 72/073; H10W 72/07331; H10W 72/07332; H10W 72/07341; H10W 72/07354; H10W 72/30; H10W 72/325; H10W 72/332; H10W 72/347; H10W 72/352; H10W 72/353; H10W 90/00; H10W 90/401; H10W 90/734
See application file for complete search history.

(56) References Cited

U.S. PATENT DOCUMENTS

| | | | |
|---|---|---|---|
| 2014/0217596 | A1 | 8/2014 | Otremba et al. |
| 2017/0144221 | A1 | 5/2017 | Ghoshal et al. |
| 2019/0043791 | A1 | 2/2019 | Haga |

FOREIGN PATENT DOCUMENTS

| | | | | |
|---|---|---|---|---|
| DE | 102013216633 | A1 * | 3/2014 | ............ H10W 72/30 |
| EP | 0 764 978 | A2 | 3/1997 | |
| EP | 2 819 127 | A1 | 12/2014 | |
| WO | 2013/185839 | A1 | 12/2013 | |

OTHER PUBLICATIONS

Chuantong Chen et al., "Necking growth and mechanical properties of sintered Ag particles with different shapes under air and N2 atmosphere", Journal of Material Science, Jul. 1, 2019, pp. 13344-13357, vol. 54, No. 20.
Luca Del Carpo et al., "Oxide-Free Copper Pastes for the Attachment of Large-Area Power Devices", Journal of Electronic Materials, Jul. 29, 2019, pp. 6823-6834, vol. 48, No. 10.
Jenny England et al., "Silver Sintering for Power Electronics", 2014 Meptec Semiconductor Packaging Technology Symposium, Oct. 23, 2014, pp. 1-21.
International Search Report for PCT/FR2022/050572, dated Nov. 8, 2022.
Communication dated Aug. 19, 2026, in Chinese Application No. 202280033766.2.

* cited by examiner

METHOD FOR MOUNTING AN ELECTRONIC COMPONENT ONTO A SUBSTRATE BY MEANS OF SINTERING

This application is a National Stage of International Application No. PCT/FR2022/050572 filed Mar. 28, 2022, claiming priority based on French Patent Application No. 2103058 filed Mar. 26, 2021, the contents of each of which being herein incorporated by reference in their entireties.

FIELD OF THE INVENTION

The invention relates to the mounting of electronic components onto a substrate using sintering by means of a material comprising, for example, silver or copper.

STATE OF THE ART

Silver-based sintering is used for assembling electronic components, whether power chips or passive components. Known sintering methods are generally classified into two categories:

- pressureless sintering from a silver sintering layer of viscous to liquid nature, previously applied onto a substrate. The component to be mounted is applied by exerting a low pressure of the order of a few hundred grams; and
- pressure sintering by means of a solid film applied to the substrate or the chip prior to the mounting of the substrate and the chip by means of high pressure.

Sintering generally requires several steps, which include the deposition of the material, its temperature conditioning and the actual sintering, optionally including pre-sintering.

The invention relates in particular to the simultaneous mounting of simple parts between two substrates, including electronic components with different thicknesses or sets of electronic components which may themselves come from the mounting of a first stack. It also relates to the mounting of components called thin components.

Consideration is given in particular to components of thin thickness in comparison with the diagonal or the largest surface dimension of the component. A critical criterion to take into account in this respect is typically that of components or substrates whose surface embedded with another element, which is non deformable or not, gives a diagonal multiplied by thickness 3 product of less than $2.3.10^2$ $mm^4$ (this quantity is proportional to the quadratic moment of the bond).

For example, suppose that attempt is made to assemble a thin chip (of dimension 5*5*0.1 $mm^3$, therefore giving a criterion of $0.9.10^{-3}$ $mm^4$) on a rigid ceramic substrate with pressureless sintering. The densification of the silver-based sintering material typically occurs from the center to the periphery of the chip. However, it causes shrinkage of the sintering. The chip is then bent, with bond lines of the sintering material sometimes having a thickness of less than 5 µm.

It is therefore sought to guarantee both a bond line thickness (or BLT) at the sintering material which is acceptable, for example greater than 50 µm, and a flatness of the chip after sintering on its diagonal better than 10 µm. This is indeed about preventing the bending and the appearance of normal forces on the surface of the substrate from causing tearing stresses during the aging of the bond. The reliability of the mounting would indeed then be degraded, a phenomenon which is called unreliability. The method sought to be obtained should therefore also be usable for components satisfying the critical criterion.

Papers writing pressureless sintering methods generally address the case where chips are collectively mounted on one side. If required, double sided sintering can be implemented with silver sinter pastes in viscous form using pressureless methods but this does not result in reliable long term assemblies. Indeed, the development of differential bending forces, reducing the service life of the assembly can be observed.

Document WO2014135151 relates to the double-sided mounting of chips of various sizes in a single step with pressure and the use of a silicone mattress on both sides allowing simultaneous pressing on several surfaces. However, this process leads to the appearance of cavities in the sintered material because it remains difficult to exert pressure everywhere with a rigid film of relatively low thickness (less than 50 µm).

Document EP3 408 863 proposes inserting spacers between the chips and the upper or lower substrates to compensate for the differences in height due to the chains of different dimensions of each mounting site and to allow simultaneous mounting under pressure of several sites. It allows to use films and to compensate for the heights with little appearance of cavities but it is difficult to be industrialized for certain configurations of the thicknesses to be completed.

Document US 2017 0092611 provides for the use of a film which is solid or formed on the substrate by direct deposition. This method under low pressure, however, remains difficult to use for the same reasons as above in the event of the need to compensate for steps of high thicknesses.

Document US 2009 0025967 describes the use of a layer of silver sintering material in the form of a viscous film to control the bond line thickness (BLT) under the chip. This is a conventional pressureless method with the application of a layer of sintering material, the placement of the chip then the sintering. It discloses drying the material in an oven before performing the sintering.

Document US 2009 0162557 discloses the deposition by screen printing or by distribution of the sintering material, its drying without the chip (called pre sintering) between 200 and 250° C. then the conventional steps of bringing the chip and the substrate closer together, and of sintering. Drying is carried out by raising the temperature in increments until reaching a target temperature maintained for a certain time. The material is brought to room temperature before mounting and sintering.

Document US8 835 299 refers to the fact of inserting between a chip to be mounted and a substrate a film including dried silver nanoparticles. The film is deposited on the substrate or the chip then dried between 150 and 250° C. Subsequently, the chip is applied to the substrate with a pressure and a temperature close to the evaporation point of the solvent containing the silver particles to allow pressure sintering in a single pass.

The application of a sintering material onto a substrate then its heat treatment at a temperature which may be less than 150° C. (paragraph 32) or up to 200° C., over a duration considered sufficient to evaporate the solvents, is described in document US 2011/0084369.

Finally, document US 2019 047044 in the name of the applicant describes a two step sintering method with a first step of pre-sintering on the complete set of the two constituents of the bond and of the joint carried out between 200 and 300° C.

These documents, for the most part, come from the movement of the first phase of the use of silver sintering, around the years 20102014, at a time when the chips were not as thin, and therefore not affected by the current need.

The creation of a solid film from a paste was intended precisely to improve the densification of sintering by adding pressure. Today, fewer and fewer customers buy silver sinter films and there is a trend towards pressureless sintering for reasons of cost and simplified implementation.

However, the fine chips generate the storage under the chip of solvents which could not be evacuated, storage causing cavities. And the reliability of assemblies in thermal cycling is poor due to the lack of control of BLT.

Therefore, there is a new problem due to the average quality of the densification on this type of chip of the sintering material in conjunction with the lack of control of the BLT.

An object of the invention is therefore to improve the mounting of the component to the substrate, to increase the quality of the densification of the sintering material and to obtain a bond line thickness at the sintering material which is acceptable, even in the presence of components satisfying the critical criterion.

DISCLOSURE OF THE INVENTION

To this end, according to the invention, a method is provided for mounting an electronic component onto a substrate, comprising the following successive steps:

- depositing sintering material onto one of an electronic component and a substrate,
- heating the material so as to bring a temperature of the material to a preliminary exothermic peak which precedes an exothermic sintering peak, without the temperature of the material reaching a maximum of the preliminary exothermic peak,
- fastening the other of the component and the substrate to the material so that the material is interposed between the component and the substrate, and
- pressing the material while hot so as to cause it to creep.

Thus the first two steps allow the material to be transformed from a liquid paste into a film capable of creeping under the action of pressure and temperature in a controlled manner between several surfaces to conform to the volume which is dedicated thereto. This paste thus conditioned is then sintered, optionally by a mixed step (sintering with then without pressure, or sintering with pressure only).

Even when present at a lower pressure level and at room temperature, this method allows to adhere the component to the substrate without initiating sintering or pre-sintering since there is no initialization of bridges (for example between the silver flakes which remain dissociated from each other) in the dried paste during the first heating. This adhesion allows the handling of the substrate(s) provided with their components for the production of 3D modules without the risk of causing the components to detach.

The method allows the mounting of thin chips. It also allows the mounting of several chips simultaneously between two substrates, including electronic components of different thicknesses or sets of electronic components which may themselves come from the mounting of a first stack.

The invention allows to increase the BLT up to 60 μm at least while guaranteeing flatness at 10 μm at most. It allows sintering to be carried out on a surface made flat and rigid but active in sintering from the start, with the help of pressure, since the component is maintained at a precise height.

The invention in particular offers the possibility of compensating for the differences in height within the framework of a 3D sandwich architecture since the sintering material, once dried, becomes a viscous paste made usable under pressure. This solution is more flexible than the use of an added film, which is not possible in all cases, in particular in the event of a large step of the order of μm between two surfaces to be mounted, and it is desired to respect a void content of less than 3%.

Finally, the method allows to obtain thicknesses comprised between a few tens of microns and a few millimeters during the distribution of the material on the same module, to ensure the covering of steps in an industrial manner.

The invention is applicable to assemblies to be made by silver sintering such as those implemented in aircraft for power modules, high temperature modules with high reliability requirements and sensors. The invention is particularly advantageous given the trend whereby more and more aircraft components are of an electrical nature.

It is possible to provide that the method of the invention also has at least one of the following characteristics:

- the deposition step takes place so that a material thickness is comprised between 60 μm and 140 μm;
- the deposition step takes place by disposing the material in boustrophedon shape;
- the deposition step takes place by forming with the material beads in mutual contact, for example over a maximum height of 10 μm, the beads having for example a diameter comprised between 100 and 300 μm;
- the deposition step takes place by depositing the material on the substrate so that, at the end of the method, the material protrudes from the edges of the component, in particular over a distance comprised between 10 and 150 μm from the edges of the component;
- the deposition step takes place by depositing the material on the component set back from the edges of the component, in particular set back by 20 to 50 μm from the edges of the component;
- the first heating step takes place for a duration comprised between 10 and 40 minutes;
- the first heating step takes place at a temperature comprised between 140° C. and 150° C.;
- the first heating step takes place in air or in an environment comprising at least 90% nitrogen;
- the first heating step takes place under a pressure below atmospheric pressure;
- the substrate being a first substrate, the pressing of the material takes place between the first substrate and a component or a second substrate, in particular at ambient temperature and in an environment under a gas pressure comprised between 0.4 and 2 MPa;
- during pressing: the pressure of a member resting on the material is measured and it is determined whether the pressure varies over a predetermined amplitude, for example comprised between 5% and 15%, for a predetermined duration, for example less than 30 seconds, and/or a position of the member resting on the material is measured and it is determined whether the position varies over a predetermined amplitude, for example comprised between 30% and 40%, for a predetermined duration, for example less than 30 seconds;

a step of sintering the material is further carried out; and one element from the component and the substrate has a contact surface with the material, at the end of the method, such that $$D*E=<2.3\cdot10^{-2}\text{ mm}^2$$

where:

D designates a greater diagonal of the contact surface, and

E indicates a maximum thickness of the element.

According to the invention provision is also made of a method for mounting an electronic component onto a substrate, comprising the following successive steps:

heating a test sample of a sintering material by exposing it to an increasing temperature, during heating, measuring a temperature of the material and detecting a first heating temperature value corresponding to a start of a preliminary exothermic peak which precedes an exothermic sintering peak and a second heating temperature value corresponding to a maximum of the preliminary exothermic peak, depositing a portion of the material onto one of an electronic component and a substrate, heating the portion by exposing it to a temperature higher than the first value and lower than the second value, fastening the other of the component and the substrate to the portion so that the portion is interposed between the component and the substrate, and pressing the portion while hot so as to cause it to creep.

Finally, according to the invention, an installation is provided for mounting an electronic component onto a substrate, the installation comprising:

a support, a member capable of exerting pressure, heating means, and means capable of controlling the execution of a method according to the invention.

DESCRIPTION OF THE FIGURES

Embodiments of the invention will now be presented by way of nonlimiting examples in support of the drawings in which.

GENERAL PRESENTATION

In the method according to the invention, the following successive steps are carried out:

depositing sintering material onto one of an electronic component and a substrate, heating the material so as to bring a temperature of the material to a preliminary exothermic peak which precedes an exothermic sintering peak without its temperature reaching a maximum of the preliminary exothermic peak, fastening the other of the component and the substrate to the material so that the material is interposed therebetween, and pressing the material while hot so as cause it to creep, before proceeding with its sintering.

The objective of the first heating step is to obtain a dried paste which can then be implemented under pressure to cause it to creep under a component to the chosen thickness. The activation of the material is obtained by drying the part coated with the material, alone, at a temperature comprised between 140 and 150° C. This drying can be done in air, under neutral gas or under vacuum with extraction.

This is a preliminary exothermic peak drying for a time not exceeding 40 minutes. Below this peak, it is not possible to apply pressure to the paste (because the paste pushes out under the action of pressure). Above this peak, in the subsequent creep step during sintering, the pressure or elevation of the arm serving to exert pressure are not able to vary by the desired amount and sintering is not effective. Most of the time in this case the chip is cracked.

Coupled analyzes by differential scanning calorimetry (DSC) and thermogravimetry (TGA) were carried out. They were carried out under air and under argon in order to determine what role the combustion of the solvents plays in their elimination.

Figure 1:
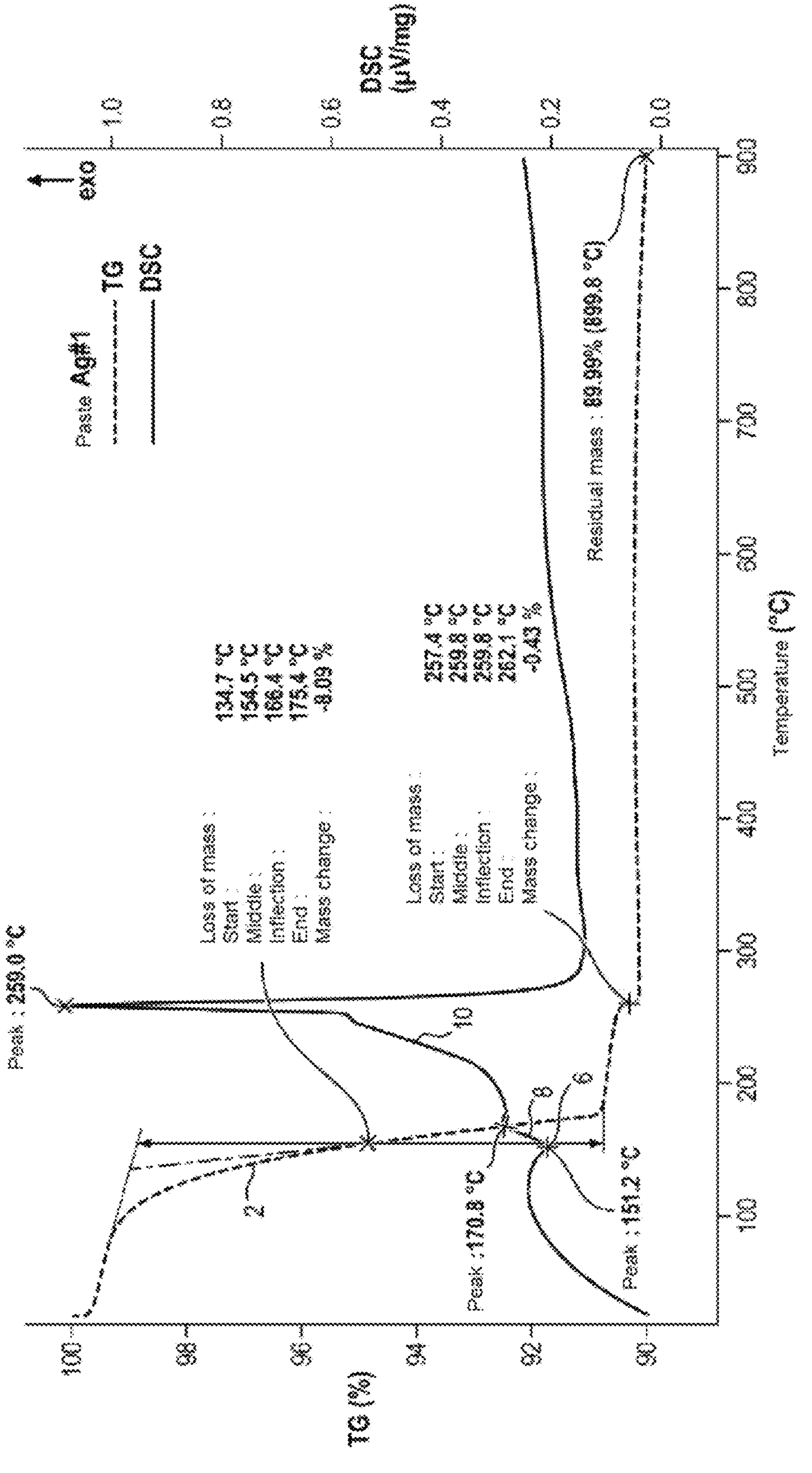
FIG. 1 is a graph showing the evolution of the mass of a sintering material (measured by thermogravimetry) marked on the ordinate axis on the left, as a function of the heating temperature applied thereto on the abscissa and the evolution of its energy (by a differential scanning calorimetry measurement) on the ordinate axis on the right, as a function of this same variable.

Thus, FIG. 1 shows the evolution of the mass of the sintering material (measured by TGA) marked on the ordinate axis on the left, as a function of the heating temperature applied thereto on the abscissa. Similarly, it shows the evolution of its energy by measuring DSC on the ordinate axis on the right, as a function of this same variable. The DSC curve is expressed in μV/mg and not in mW/mg. These coupled DSC/TGA analyzes relate here to a silver-based sinter paste in air. This is the paste marketed by the company Henkel under the name LOCTITE ABLESTIK SSP 2020. The crucibles used were made of alumina. The material is exposed to gradual heating with a temperature rise rate of 10° C./min.

Whether the experiment is carried out under air or under argon, the TGA curve shows that the loss of mass of this paste n° 1 (and therefore the evacuation of the solvents) takes place in two stages: a first major loss of mass, begins at 130° C. in both cases (first bump 2 visible in the figure) and a second, minor loss of mass, is observed above 250° C.

The major loss of mass coincides from 130° C. with two small peaks on the DSC curve. The first 6 is rather endothermic, the other 8 is exothermic. The small size of the peaks 6, 8 can be explained by the fact that, thermally, the two phenomena, which are more or less simultaneous, compensate each other.

Figure 2:
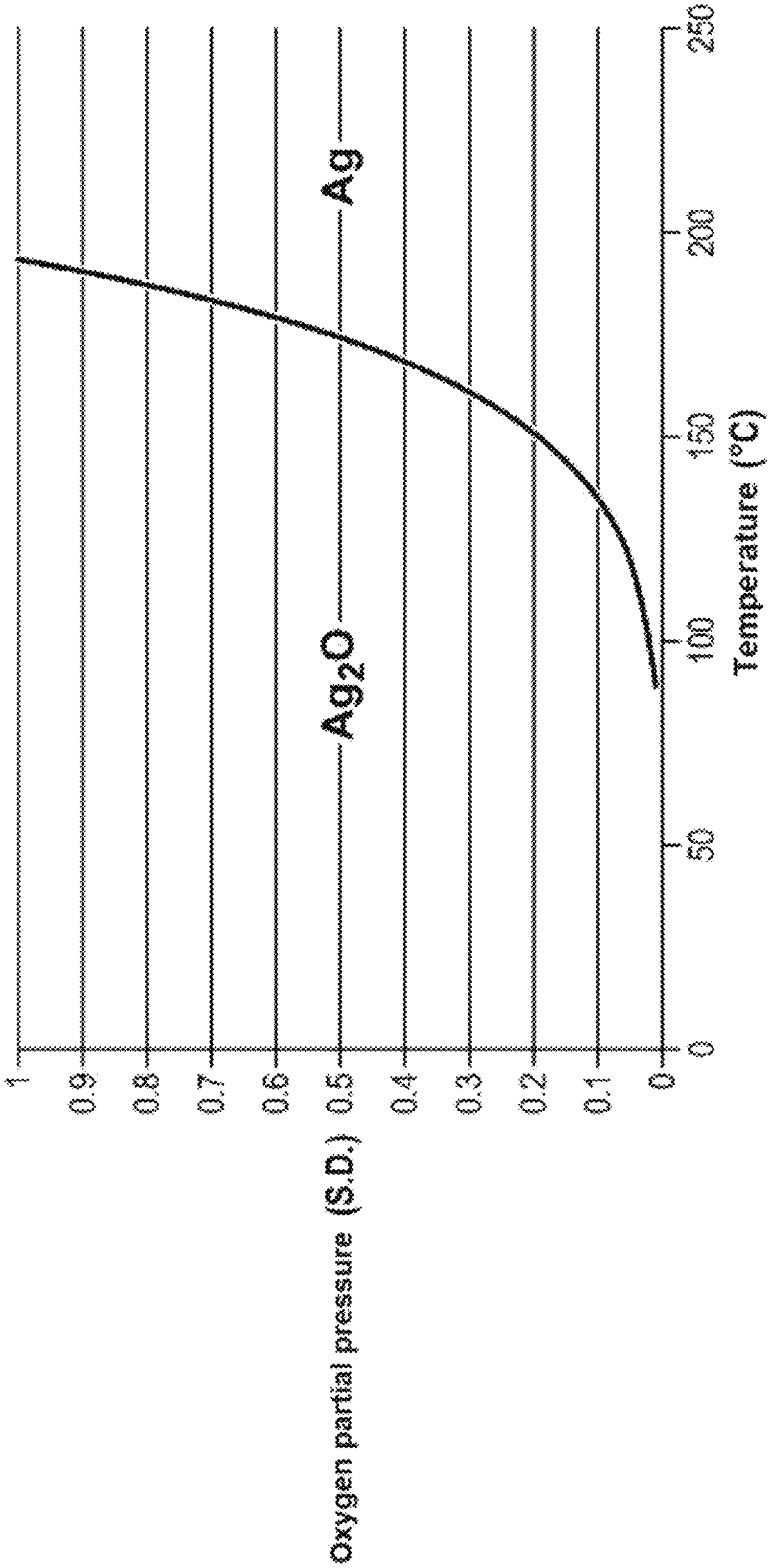
FIG. 2 is a graph of the thermodynamic stability ranges of silver and its oxide as a function of temperature and oxygen partial pressure.

Concerning the first peak 6, the loss of mass which is initialized at 130° C. is representative of the evaporation of the solvents and this is a datum provided by the manufacturer. It continues in practice up to 170.8° C. In this zone, the solvent remains present and clearly blocks the formation of silver oxide ($Ag_2O_3$) which could otherwise take place below 150° C. FIG. 2 indeed illustrates the domains of thermodynamic stability of silver and of its oxide as a function of temperature and oxygen partial pressure. It shows that, in an atmosphere composed of 20% oxygen, silver oxide is not thermodynamically stable above 150° C. Below this temperature, although thermodynamically possible, the silver oxidation reaction does not occur because it is kinetically blocked, which is the case in FIG. 1 thanks to the presence of an organic protective compound in the paste.

The first (and small) exothermic peak 8 which appears in FIG. 1 from 151.2° C. and which has its maximum at 170.8° C. is not mentioned either by the manufacturer or in the literature.

Figure 3:
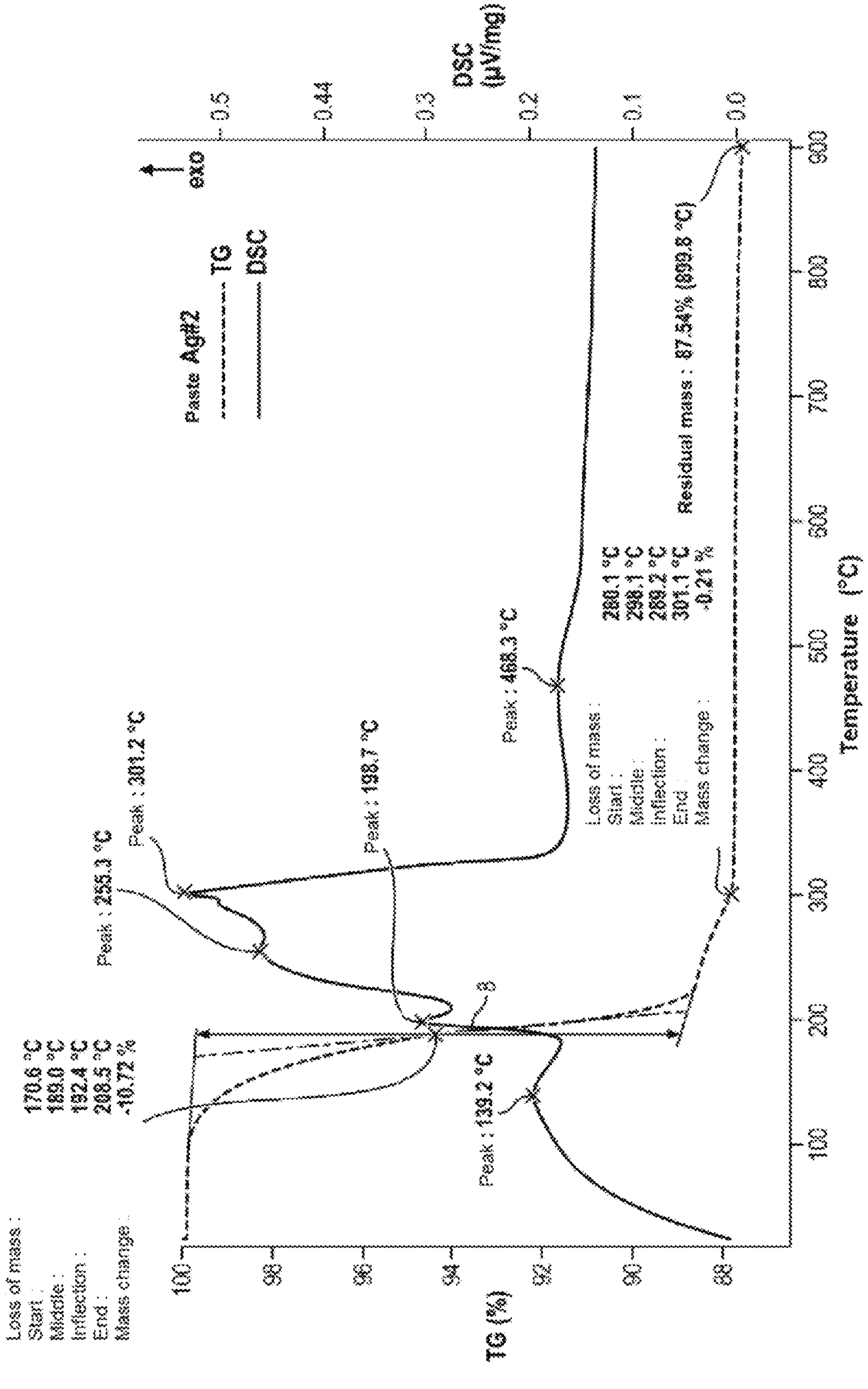
FIG. 3 is a graph similar to that of FIG. 1 for a second sintering material.

It is found on a similar analysis carried out under air on a sinter paste of another brand, which is also silver-based, and illustrated in FIG. 3. This is the paste marketed by the company Heraeus under the name Magic® DA295A. (Similar analyzes can be carried out on a paste marketed under the name Argomax® Alpha® by the company MacDermid Alpha Electronics Solutions and on a paste marketed under the name Quicksinter® by the company Indium Corporation). Here the first exothermic peak 8 starts at 192.4 and has its maximum at 198.7° C. Again, it is not mentioned by the manufacturer. In any case, only the evaporation of the solvents at 130° C. is mentioned by the manufacturers or the literature. However, between 130° C. and 170° C., other major phenomena are present.

Beyond 130° C. and below 170° C., this results in nonoxidized silver flakes having a size comprised between a few hundred nanometers and a few tens of microns and traces of solvents.

DSC coupled with TGA clearly shows that, in air, during major loss of mass, there is competition between an exothermic phenomenon and an endothermic phenomenon (combustion and evaporation). On the other hand, under argon, the main loss of mass corresponds to an endothermic peak. This means that, under neutral gas, the main loss of mass occurs more by evaporation than by decomposition of solvents.

However, this competition of the phenomena which appear in this zone, but potentially at different temperatures according to the pastes, gives rise to the exothermic peak 8 of the DSC curve which is the marker of the activation of the silver flakes for a subsequent creep or sintering.

It is observed that this exothermic peak 8 immediately precedes the main exothermic peak 10 associated with sintering.

If a temperature of 170° C. is exceeded, beyond the first exothermic peak 8 therefore, sintering begins to occur (the paste is made solid but not yet sufficiently densified), so that the paste is no longer conformable at the surfaces in presence by an application of pressure and temperature, for a creep or by need of adhesion.

Conversely, if the first heating step is interrupted before the start of the exothermic peak 8 with a minimum at 151.2° C. but a beginning of appearance of the phenomenon around 140° C. in FIG. 1 and around 192.4° C. in FIG. 3, the pressure applied during sintering does not allow controlled creep of the material. Indeed, one is then faced with an uncontrolled outpouring of the paste as if pressure was applied to a non-dried liquid paste. It is then not possible to obtain a paste which is conformable in surface (horizontal creep) and in thickness (vertical creep). To control this creep on the volume dedicated thereto, pressure must be applied to a joint which has undergone prior drying in accordance with the definition of this preliminary exothermic peak 8.

During an experiment, the preliminary exothermic peak 8 must be determined in air because it does not appear in the DSC under neutral gas or under vacuum.

On the basis of these elements, the invention is implemented as follows by way of example.

First Embodiment

A first embodiment of the invention will be described.

Figure 4:
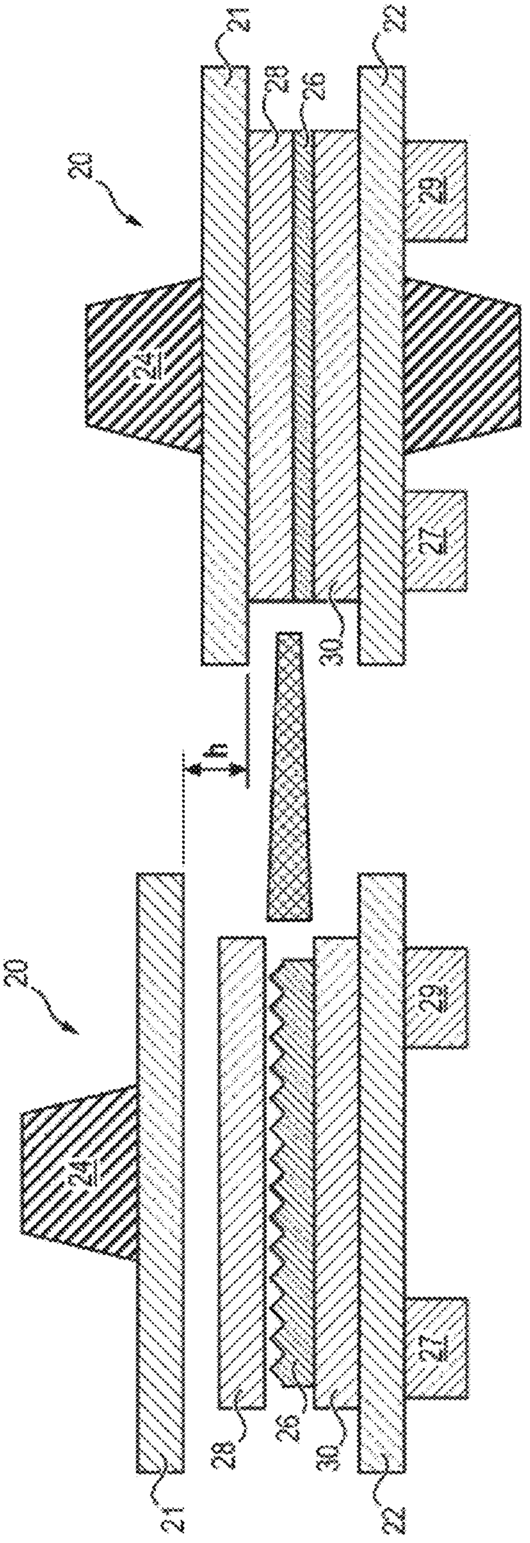
FIG. 4 shows two steps of the method according to the invention implemented in an installation according to the invention.

The method is implemented in an installation 20 like that of FIG. 4. It comprises:

- a support or frame 22,
- a member such as an arm 24 mounted to move relative to the support capable of exerting pressure,
- a plate 21 fastened to the lower end of the arm and extending opposite the support,
- heating means 27, the heating means may include a heater, and
- control means 29 capable of controlling the execution of the method, the control means 29 may include a controller.

Material Deposition

In a first step, a sintering material 26 is deposited onto one of an electronic component 28 and a substrate 30, for example the substrate 30.

Figure 5:
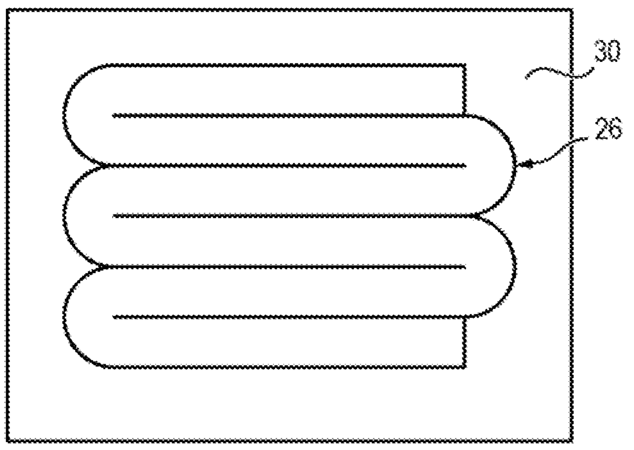
FIG. 5 is a plan view of the sintering material as placed before drying.
Figure 6:
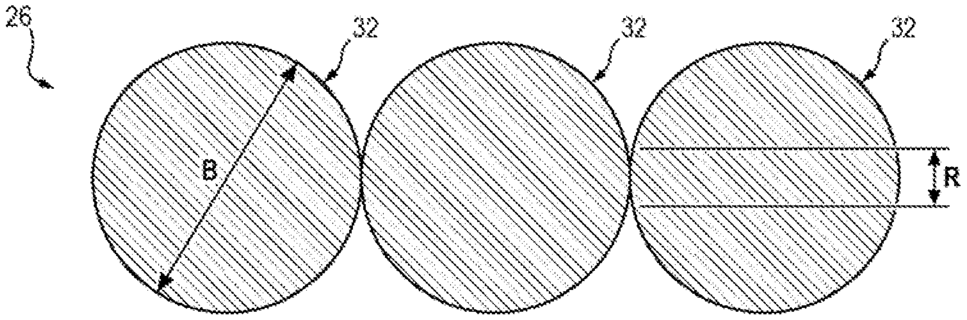
FIG. 6 is a sectional view of the coil formed by the material of FIG. 5.

The deposition step takes place here by disposing the boustrophedon-shaped material following a continuous coil as illustrated in FIG. 5, by forming with the material beads in mutual contact as illustrated in FIG. 6, for example over a maximum height R of 10 μm. The beads have for example a diameter B comprised between 100 and 300 μm. The deposition step takes place in this case such that a material thickness is comprised between 60 μm and 140 μm. The material is deposited on the substrate so that, at the end of the method, the material protrudes from the edges of the component 28, in particular over a distance comprised between 10 and 150 μm from the edges of the component.

The diameter of the paste coils depends on the final thickness to be reached at the end of sintering. It does not condition the steps of the method because, once dried in accordance with the preliminary exothermic peak 8, the paste 26 conforms to the need, allowing a total flattening of the coils (no cavity is observed under the components) to form a single rectangular parallelepiped of defined surface and thickness. It is thus possible to obtain variable bonding layer thicknesses comprised between 1 and 10 mm.

The paste is chosen from commercial references.

The sintering material is spread by automatic or manual dispensing at room temperature. It is in fact preferred to place it by distribution rather than by screen printing because its application by screen printing does not allow to limit the rises over several tens of microns in height during the demolding of the screen printing frame. Moreover, the distribution gives very good control of the rate of cavities at the end of sintering, in particular a rate of less than 1% on the surface of the component.

Activation of the Material by Prior Drying

Next, the material 26 is heated so as to place the temperature of the material in the increasing phase of the preliminary exothermic peak 8 which precedes the exothermic sintering peak 10 without the temperature of the material reaching the maximum of the preliminary exothermic peak 8 (170.8° C. in FIG. 1).

This first heating step takes place in this case for a duration comprised between and 40 minutes at a temperature comprised between 140° C. and 150° C.

This heating takes place either in air or in an environment comprising at least 90% nitrogen, optionally under a pressure below atmospheric pressure.

Fastening

Then, the component 28 is fastened to the material 26 so that the material is interposed between the component 28 and the substrate 30.

If the substrate is intended for an assembly with a component and another substrate (which is the case of a 3D sandwich structure like that of FIG. 7), the component is aligned with the material then pressed thereon at ambient temperature between 0.4 and 2 MPa to allow its adhesion to the substrate for manual or automatic handling of the assembly formed by the substrate and the component. The assembly can thus be turned over, moved and handled to allow subsequent operations in order to obtain the 3D structure.

In other cases, the component 28 is simply contacted with the material 26 on the substrate and then the actual sintering step is carried out.

Creep

Then, indeed, in the installation 20 of FIG. 4, pressure is applied to the material 26 and it is heated so as to cause it to creep. The pressure is obtained as illustrated in FIG. 4 by pressing the material by means of the arm 24 between the component 28 and the support 22, against the substrate 30. Then, this causes the paste to creep.

During this step, the pressure of the arm 24 resting on the material 26 is measured and it is determined whether the pressure varies over a predetermined amplitude, for example comprised between 5% and 15%, for a predetermined duration, for example less than 30 seconds. Creep is acceptable in this case when the measured pressure has varied between 5 to 15% of its original value then stabilizes in less than 30 seconds.

In addition, a position of the arm 24 resting on the material 26 is measured and it is determined whether its position varies over a predetermined amplitude for a predetermined duration. The position measured here is the distance from the plate 21 to the face of the substrate 30 receiving the material 26. The variation in position therefore corresponds to the variation in thickness of the paste. It is considered in this case that the creep is acceptable when this distance has varied between 30 and 40% of the distance before the start of sintering (for example it goes from 100 μm to a value between 60 and 70 μm) in a time which does not exceed 30 seconds. The variation in distance h has been illustrated in FIG. 4.

These steps are carried out using conventional servo-control means.

Once this step is completed, the material is ready to be sintered in a subsequent heating step so that the component is firmly fastened to the substrate.

The invention is applicable in particular when the component 28 is called thin component, namely has a contact surface with the material, at the end of the method, such that $$D*E=<2.3\cdot10^{-2}\ \mathrm{mm}^2$$

where:

D designates a greater diagonal of the contact surface, and
E indicates a maximum thickness of the element.

Figure 7:
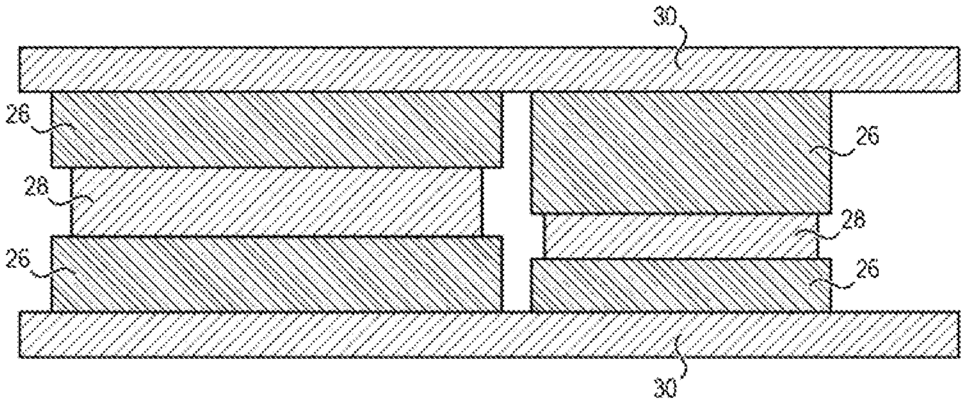
FIG. 7 is a view of a sandwich structure made by means of the invention.

The invention is also applicable to the production of a sandwich or 3D structure like that of FIG. 7. This structure here comprises two substrates 30 between which are interposed two components 28 of dimensions different from each other. In particular, the two components 28 differ in their height. A layer of sintering material 26 is interposed between the first component 28, on the left in the figure, and the lower substrate, and another layer 28 is interposed between this same component and the upper substrate 30. Two other layers of sintering material 26 are likewise interposed between the right component 28 and the respective substrates 30. The arrangement may comprise a greater number of components interposed between the two substrates in this way. Or else, a larger number of components can be stacked with each other in the same stack with the interposition of a layer of sintering material between two components, between the two substrates.

To achieve the arrangement of FIG. 7, the two lower layers of sintering material 26 are disposed on the lower substrate 30 then the step of drying this material is carried out.

Then the two components 28 are installed and the other two layers of sintering material are applied thereon. A new drying step is then carried out.

The upper substrate 30 is then applied. For this purpose, the components are pressed between the two substrates, in particular at room temperature and in an environment under a gas pressure comprised between 0.4 and 2 MPa.

The simultaneous creep of all the layers of material 26 is then carried out. For this purpose, a silicone mattress is placed under the plate and all the components are pressed, for example under 250° C./10 MPa. During this last step, the pressure applied by the arm allows to maintain parallelism between the two faces of the substrates facing each other and therefore to compensate for the differences in height between the components 28.

The material is then sintered.

Second Embodiment

In this second embodiment, a method for testing a sintering material is first implemented.

A test sample of the sintering material is heated by exposing it to an increasing temperature.

During heating, a temperature of the material is measured. A first heating temperature value corresponding to a start (151.2° C. in FIG. 1) of a preliminary exothermic peak 8 which precedes an exothermic sintering peak 10 is detected. This value is a local minimum. A second heating temperature value corresponding to a maximum of the preliminary exothermic peak 8 (170.8° C. in FIG. 1) is also detected. These tests are carried out for example like the aforementioned analyses.

Next, a method is implemented for mounting an electronic component onto a substrate in a manner similar to the first embodiment. The method this time comprises the following successive steps:

depositing a portion of the material 26 onto one of an electronic component 28 and a substrate 30,
heating the portion 26 by exposing it to a temperature higher than the first value and lower than the second value,
fastening the other of the component and the substrate to the portion so that the portion is interposed between the component and the substrate, and
pressing the portion while hot so as to cause it to creep.

The sintering is then carried out.

Many modifications may be made to the invention without departing from the scope thereof.

The invention claimed is:

1. A method for mounting an electronic component onto a substrate the method comprising the following successive steps:
depositing a sintering material onto the electronic component or onto the substrate;
heating the sintering material so as to bring a temperature of the sintering material to a preliminary exothermic peak which precedes an exothermic sintering peak without the temperature of the sintering material reaching a maximum of the preliminary exothermic peak;

fastening either the electronic component or the substrate that did not receive the sintering material to the sintering material so that the sintering material is interposed between the electronic component and the substrate; and pressing the sintering material while hot so as to cause the sintering material to creep.

2. The method according to claim 1, wherein the depositing takes place so that a sintering material thickness is between 60 μm and 140 μm.

3. The method according to claim 1, wherein the depositing takes place by disposing the sintering material in boustrophedon shape.

4. The method according to claim 1, wherein the depositing takes place by forming beads with the sintering material, the beads being in mutual contact.

5. The method according to claim 4, wherein the beads are in mutual contact over a height less than or equal to 10 μm.

6. The method according to claim 1, wherein the depositing takes place by depositing the sintering material on the substrate so that, after the pressing, the sintering material protrudes from edges of the electronic component.

7. The method according to claim 1, wherein the depositing takes place by depositing the sintering material on the electronic component set back from edges of the electronic component.

8. The method according to claim 1, wherein the temperature of the sintering material is between 140° C. and 150° C.

9. The method according to claim 1, wherein the heating takes place for a duration between 10 and 40 minutes.

10. The method according to claim 1, wherein the pressing of the sintering material takes place between the substrate and a second substrate.

11. The method according to claim 1, wherein the method comprises during the pressing:

measuring a pressure of an arm resting on the sintering material and determining whether the pressure varies over a first predetermined amplitude for a first predetermined duration; and/or measuring a position of the arm resting on the material and determining whether the position varies over a second predetermined amplitude for a second predetermined duration.

12. The method according to claim 11, wherein the first predetermined amplitude is between 5% and 15% of the pressure.

13. The method according to claim 11, wherein the first predetermined duration is less than 30 seconds.

14. The method according to claim 11, wherein the second predetermined amplitude is between 30% and 40% of the position.

15. The method according to claim 11, wherein the second predetermined duration is less than 30 seconds.

16. The method according to claim 1, further comprising sintering the sintering material.

17. The method according to claim 1, wherein one of the electronic component and the substrate comprises a contact surface with the sintering material after pressing the sintering material, wherein a product of a greater diagonal of the contact surface multiplied by a maximum thickness of the one of the electronic component and the substrate comprising the contact surface is less than or equal to $2.3 \cdot 10^{-2}$ $mm^2$.

18. The method according to claim 4, wherein a diameter of each bead of the beads is between 100 μm and 300 μm.

19. A method for mounting an electronic component onto a substrate, the method comprising the following successive steps:

heating a test sample of a sintering material by exposing the test sample to an increasing temperature and measuring a temperature of the sintering material and detecting a first heating temperature value corresponding to a start of a preliminary exothermic peak which precedes an exothermic sintering peak and a second heating temperature value corresponding to a maximum of the preliminary exothermic peak;

depositing a portion of the sintering material onto the electronic component or onto the substrate;

heating the portion of the sintering material by exposing the portion of the sintering material to a temperature higher than the first value and lower than the second value;

fastening either the electronic component or the substrate that did not receive the sintering material to the portion of the sintering material so that the portion of the sintering material is interposed between the electronic component and the substrate; and pressing the portion of the sintering material while hot so as to cause the portion to creep.

20. An assembly for mounting an electronic component onto a substrate, the assembly comprising:

a support, a member configured to exert a pressure, a heater, and a controller configured to control:

a deposit of a sintering material onto the electronic component or onto the substrate;

a heating of the sintering material so as to bring a temperature of the sintering material to a preliminary exothermic peak which precedes an exothermic sintering peak without the temperature of the sintering material reaching a maximum of the preliminary exothermic peak;

a fastening of either the electronic component or the substrate that did not receive the sintering material to the sintering material so that the sintering material is interposed between the electronic component and the substrate; and a pressing of the sintering material while hot so as to cause it to creep.

* * * * *